US012713600B2

(12) United States Patent
Hopkins et al.

(10) Patent No.: US 12,713,600 B2
(45) Date of Patent: Aug. 18, 2026

(54) MICROELECTRONIC DEVICES INCLUDING A DOPED DIELECTRIC MATERIAL, METHODS OF FORMING THE MICROELECTRONIC DEVICES, AND RELATED SYSTEMS

(71) Applicant: Micron Technology, Inc., Boise, ID (US)

(72) Inventors: John D. Hopkins, Meridian, ID (US); Jordan D. Greenlee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 758 days.

(21) Appl. No.: 18/047,230

(22) Filed: Oct. 17, 2022

(65) Prior Publication Data

US 2024/0130121 A1 Apr. 18, 2024

(51) Int. Cl.
*H10B 43/27* (2023.01)

(52) U.S. Cl.
CPC .................................... *H10B 43/27* (2023.02)

(58) Field of Classification Search
CPC ........ H10B 43/27; H10B 41/10; H10B 41/27; H10B 43/50; H10B 43/10
See application file for complete search history.

(56) References Cited

U.S. PATENT DOCUMENTS

2021/0210499 A1* 7/2021 Jhothiraman .......... H10B 43/50
2023/0087072 A1* 3/2023 Kang .................... H10B 43/40
438/197

* cited by examiner

*Primary Examiner* — Jonathan Han
(74) *Attorney, Agent, or Firm* — TraskBritt

(57) ABSTRACT

A microelectronic device comprising tiers of alternating dielectric materials and conductive materials, pillars extending through the tiers, and a doped dielectric material adjacent to the tiers. The doped dielectric material comprises a heterogeneous chemical composition comprising one or more dopants. Conductive contact structures are in the doped dielectric material. Additional microelectronic devices, microelectronic systems, and methods of forming microelectronic devices are disclosed.

25 Claims, 12 Drawing Sheets

MICROELECTRONIC DEVICES INCLUDING A DOPED DIELECTRIC MATERIAL, METHODS OF FORMING THE MICROELECTRONIC DEVICES, AND RELATED SYSTEMS

TECHNICAL FIELD

Embodiments disclosed herein relate to microelectronic devices and microelectronic device fabrication. More particularly, embodiments of the disclosure relate to microelectronic devices including a doped dielectric material having one or more dopants, and to related systems and methods.

BACKGROUND

Memory devices provide data storage for electronic systems. A Flash memory device is one of various memory device types and has numerous uses in modern computers and other electrical devices. A conventional Flash memory device includes a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a three-dimensional NAND (3D NAND) memory device, a type of vertical memory device, not only are the memory cells arranged in rows and columns in a horizontal array, but tiers of the horizontal arrays are stacked (e.g., vertically stacked) over one another to provide a three-dimensional array of the memory cells. The tiers include alternating conductive materials with insulating (e.g., dielectric) materials. The conductive materials function as control gates for, e.g., access lines (e.g., word lines) of the memory cells. Vertical structures (e.g., pillars including channel materials) extend along the vertical string of the memory cells. A drain end of a string is adjacent to one of the top and bottom of the vertical structure (e.g., pillar), while a source end of the string is adjacent to the other of the top and bottom of the pillar. The drain end is operably connected to a bit line, while the source end is operably connected to a source line. 3D NAND memory devices also include electrical connections between the access lines and other conductive structures of the device so that the memory cells of the vertical strings can be selected for writing, reading, and erasing operations. String drivers drive the access line voltages to write to or read from the memory cells of the vertical string.

As memory density increases in the 3D NAND memory devices, increased aspect ratios of pillars (e.g., the length of the pillar versus the width of the pillar opening) occur. However, as the aspect ratios of pillars increase, possibilities for pillar misalignment and reduced connectivity of conductive features also increase. At the same time, the dimensions and spacing of the conductive features have simultaneously decreased, making it more difficult to electrically connect the conductive features to one another without shorts occurring. For example, a 3D NAND memory device includes wiring structures at different levels, with the wiring structures formed of electrically conductive materials to provide conductive pathways through the memory device. As the dimensions and spacing of the conductive features continue to decrease, parasitic (e.g., stray) capacitance between adjacent conductive features within the memory device increases. The increased parasitic capacitance causes higher power demands and delay of the memory device.

BRIEF DESCRIPTION OF THE DRAWINGS

For a detailed understanding of the present disclosure, reference should be made to the following detailed description, taken in conjunction with the accompanying drawings, in which like elements have generally been designated with like numerals, and wherein:

FIGS. 7A through 7-1B are partial cross-section and top views illustrating a method of forming a microelectronic device, in accordance with embodiments of the disclosure.

DETAILED DESCRIPTION

Figures 1A, 1B:
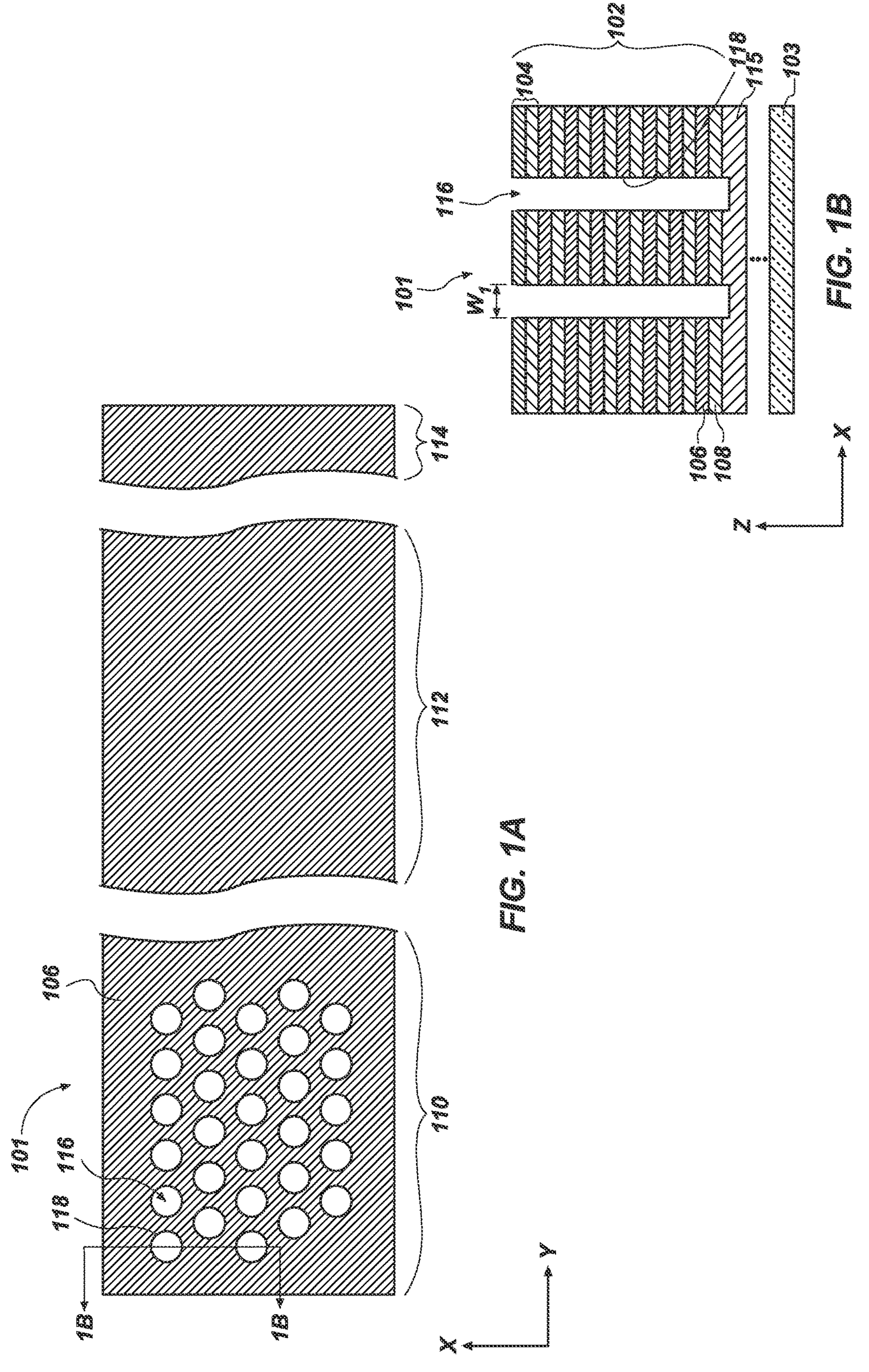
FIGS. 1A and 1B are partial cross-section and top views illustrating a method of forming a microelectronic structure, in accordance with embodiments of the disclosure.

A microelectronic device (e.g., an apparatus, an electronic device, a semiconductor device, a memory device) is disclosed that includes a doped cap dielectric material that includes one or more dopants heterogeneously distributed throughout the doped cap dielectric material. Portions of the doped cap dielectric material are formulated to be selectively removable (e.g., selectively etchable) relative to other portions of the doped cap dielectric material. The doped cap dielectric material is positioned above an upper tier of tiers of the microelectronic device. The portions of the doped cap dielectric material exhibit a different dopant concentration than other portions of the doped cap dielectric material, with the different dopant concentrations enabling the selective removal of the portions. The portions of the doped cap dielectric material are removed by different removal processes to form conductive structure openings having a width that is less than or substantially equal to a critical dimension (CD) of underlying pillars or plugs. The portions of the doped cap dielectric material are removed without substantially removing other dielectric materials beneath the doped cap dielectric material. A conductive material is formed in the conductive structure openings to form conductive structures that have a width that is less than or substantially equal to the CD of the pillars. The reduced or substantially equal CDs of the conductive structures enable the conductive structures to be formed with reduced parasitic capacitance between adjacent conductive structures such that inadvertent electrical connections (e.g., shorts) are reduced or substantially eliminated. The separate material removal acts conducted at different times also reduces misalignment between the conductive structures and other conductive materials of the microelectronic device.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms of the terms "a," "an," and "the" are intended to include the plural forms as well, unless the context clearly indicates otherwise.

As used herein, the term "and/or" includes any and all combinations of one or more of the associated listed items.

As used herein, the terms "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "array region" means and includes a region of an electronic device including memory cells of a memory array. The array region of the electronic device includes active circuitry.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct ohmic connection or through an indirect connection (e.g., by way of another structure).

As used herein, the term "microelectronic device" includes, without limitation, an electronic device, such as a memory device, as well as a semiconductor device which may or may not incorporate memory, such as a logic device, a processor device, or a radiofrequency (RF) device. Further, a microelectronic device may incorporate memory in addition to other functions such as, for example, a so-called "system on a chip" (SoC) including a processor and memory, or a microelectronic device including logic and memory. The microelectronic device includes tiers of alternating conductive materials and dielectric materials.

As used herein, the term "microelectronic device structure" means and includes a precursor structure to the microelectronic device, with tiers of alternating conductive materials and dielectric materials.

As used herein, the term "microelectronic structure" means and includes a precursor structure to the microelectronic device structure, with tiers of alternating nitride materials and dielectric materials.

As used herein, the terms "horizontal" or "lateral" mean and include a direction that is parallel to a primary surface of the substrate on which the referenced material or structure is located. The width and length of a respective material or structure may be defined as dimensions in a horizontal plane. With reference to the figures, the "horizontal" or "lateral" direction may be perpendicular to an indicated "Z" axis and may be parallel to an indicated "X" axis, and the term "lateral" may be perpendicular to an indicated "Z" axis and may be parallel to an indicated "Y" axis.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the term "non-array region" means and includes a region of the microelectronic device proximal to the array region.

As used herein, the term "selectively removable" means and includes a material that exhibits a greater removal rate responsive to exposure to a removal chemistry and/or removal conditions, collectively referred to herein as process conditions, relative to another material exposed to the same removal chemistry and/or removal conditions. A material that is selectively removable relative to another material is substantially completely removable without removing substantially any of the another material.

As used herein, the term "selectively etchable" means and includes a material that exhibits a greater etch rate responsive to exposure to a given etch chemistry and/or etch conditions relative to another material exposed to the same etch chemistry and/or etch conditions. For example, the material may exhibit an etch rate that is at least about five times greater than the etch rate of another material, such as an etch rate of about five times greater, about ten times greater, about twenty times greater, or about forty times greater than the etch rate of the another material. Etch chemistries and etch conditions for selectively etching a desired material may be selected by a person of ordinary skill in the art.

As used herein, the term "doped cap dielectric material" means and includes a dielectric material including one or more dopants, with the dopant heterogeneously distributed throughout the dielectric material. The doped cap dielectric material includes a desired dopant profile. The doped cap dielectric material includes a gradient of the dopant or includes two or more discrete regions of different dopant concentrations. The dopant concentration increases or decreases from one region to another (e.g., along a vertical height of the cap dielectric material).

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a material (e.g., a base material) or construction upon which additional materials are formed. The substrate may be a microelectronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the microelectronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOT") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure (e.g., parallel to the Z-axis). The major plane of the structure is defined by a surface of the structure having a relatively large area compared to other surfaces of the structure. The height of a respective material or feature (e.g., structure) may be defined as a dimension in a vertical plane.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing an apparatus (e.g., a microelectronic device, a semiconductor device, a memory device), the structures thereof, or the systems. The remainder of the process flow is known to those of ordinary skill in the art. Accordingly, only the methods and structures necessary to understand embodiments of the present apparatus and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art. Unless the context indicates otherwise, the removal of materials described herein may be accomplished by any suitable technique including, but not limited to, etching (e.g., dry etching, wet etching, vapor etching), ion milling, abrasive planarization, or other known methods.

Referring to FIGS. 1A and 1B, a microelectronic device structure 101 includes a stack 102 formed over a substrate 103. The stack 102 may include tiers 104 of alternating nitride materials 106 and dielectric materials 108. The microelectronic device structure 101 includes an array region 110, edge of array (EOA) region 112, and a periphery region 114. The EOA region 112 and the periphery region 114 may comprise a non-array region. A source 115 may be formed vertically adjacent the lowermost tier of the tiers 104 by conventional techniques.

The substrate 103 comprises a substrate material, upon which the tiers 104 of alternating nitride materials 106 and dielectric materials 108 are formed. Alternatively, the substrate 103 comprises another stack, similar to stack 102 including capping dielectric materials, as discussed below. An interdeck region (not shown) may be present between the stack 102 and the stack, which are vertically adjacent to one another. The stack or substrate 103 comprises circuitry, such as control logic circuitry, configured to control various operations of other features of microelectronic device 100 (see FIGS. 7A and 7B).

The nitride materials 106 may be, for example, at least one dielectric nitride material (e.g., a silicon nitride ($SiN_y$)). As used herein, x, y, or z are positive real numbers. In some embodiments, the nitride materials 106 may be silicon nitride. The dielectric materials 108 may be an electrically insulative material. By way of non-limiting example, the dielectric materials 108 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), and at least one dielectric carboxynitride material (e.g., $SiO_xC_zN_y$). In some embodiments, the dielectric materials 108 may be formed of and may include a dielectric oxide material (e.g., $SiO_x$, such as $SiO_2$). The dielectric materials 108 may be configured to electrically isolate conductive materials. Each of the alternating materials (e.g., nitride materials 106 and dielectric materials 108) may be substantially homogeneous in material composition, each of the alternating materials 106, 108 may be heterogeneous in material composition, or one of the alternating materials 106, 108 may be substantially homogenous in material composition, while the other is substantially heterogeneous in material composition.

The array region 110 may include pillar openings 116 defined by sidewalls 118 of the tiers 104. While the sidewalls 118 are illustrated as being substantially vertical, the sidewalls 118 may include tapering (e.g., in one or two directions, such as upward and outward, downward and inward, or combinations thereof). A distance between opposing sidewalls 118 of the pillar openings 116 may have a width, $W_1$, defining a critical dimension (CD) of the pillar openings 116 and the resulting pillars formed in the pillar openings 116.

Figures 2A, 2B:
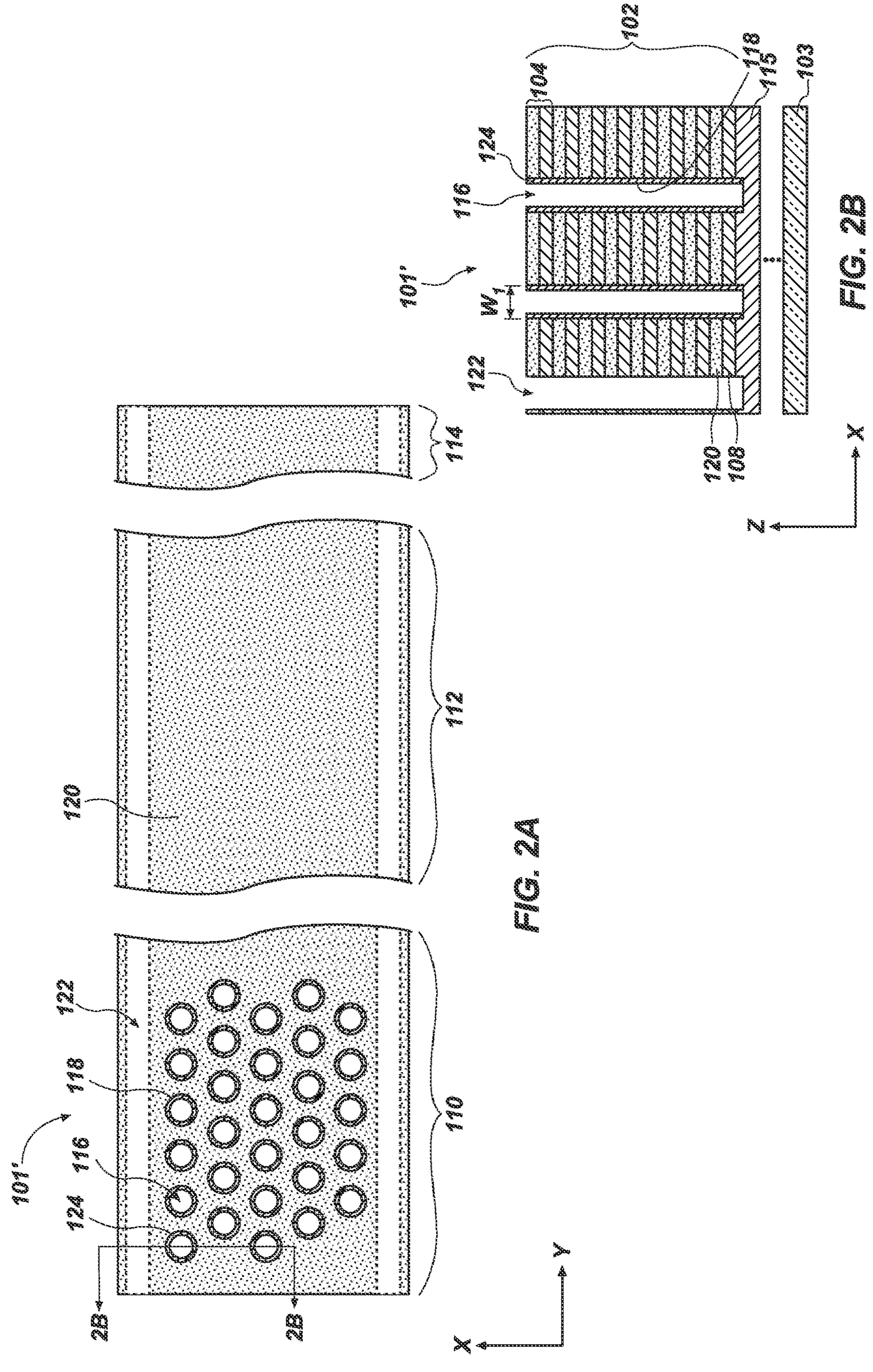
FIGS. 2A and 2B are partial cross-section and top views illustrating a method of forming a microelectronic device structure, in accordance with embodiments of the disclosure.

Referring now to FIGS. 2A and 2B, the nitride materials 106 of the tiers 104 are removed through a slit 122 to form openings (not shown) between vertically adjacent dielectric materials 108 of the tiers 104, forming microelectronic device structure 101'. Conductive materials 120 are formed in the openings between the dielectric materials 108 of the tiers 104. The nitride materials 106 are, therefore, removed and replaced with the conductive materials 120 through the slit 122 as part of a so-called "replacement gate" or "gate last" process. Although slit 122 is depicted as running along the y-axis, being parallel with a lateral dimension of the microelectronic device structure 101, in other embodiments, the slit 122 may be oriented along a different direction, such as the x-axis, being parallel with a horizontal dimension of the microelectronic device structure 101.

The nitride materials 106 of the tiers 104 may be removed by exposing the nitride materials to a wet etchant comprising one or more of phosphoric acid, sulfuric acid, hydrochloric acid, nitric acid, or another etch chemistry. The nitride materials 106 may be selectively removed, such as by a so-called "wet nitride strip" comprising a wet etchant comprising phosphoric acid. After removal of the nitride materials 106, the conductive materials 120 may be formed between the neighboring dielectric materials 108 at locations corresponding to the previous locations of the nitride materials 106 to form the microelectronic device structure 101' comprising tiers of alternating levels of dielectric materials 108 and conductive materials 120. The conductive materials 120 may function as access lines (e.g., word lines). One or more lower conductive materials 120 of the microelectronic device structure 101' may function as one or more lower select gate (e.g., at least one source side select gate (SGS)) and one or more upper conductive materials 120 may function as at least one upper select gate (e.g., at least one drain side select gate (SGD)) of the microelectronic device structure 101'.

The conductive materials 120 may each individually be formed of and include an electrically conductive material, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the conductive materials 120 comprise tungsten.

The conductive materials 120 may include a conductive liner material (not shown) around the conductive materials 120, such as between the conductive materials 120 and the dielectric materials 108. The conductive liner material may comprise, for example, a seed material from which the conductive materials 120 are formed. The conductive liner material may be formed of and include, for example, a metal (e.g., titanium, tantalum), a metal nitride (e.g., tungsten nitride, titanium nitride, tantalum nitride), or another material. In some embodiments, the conductive liner material comprises titanium nitride.

Cell materials 124 are conformally formed on the sidewalls 118 of the tiers 104 and partially fill the pillar openings 116. Although multiple materials are present, the cell materials 124 are shown as a single material in FIGS. 2A-3B for simplicity and convenience. The cell materials may include one or more of a dielectric material, a conductive material, etc. The cell material(s) may include one or more of an oxide material, a storage material, or a tunnel dielectric material. The cell materials 124 may include a charge blocking material, a charge trap material, a tunnel dielectric material, and a channel. Each of these materials may be formed using conventional techniques. The cell materials 124 extend through the tiers 104 and into the source 115.

While not shown in the perspectives of FIGS. 2A-3B and subsequent drawings, other components of the microelectronic device structure 101' are present. The additional components may be present in locations of the microelectronic device 100 or microelectronic device structure 101' that are not depicted. The additional components are formed by conventional techniques. The additional components may include, but are not limited to, staircase structures, interdeck structures, contacts, interconnects, data lines (e.g., bit lines), access lines (e.g., word lines), etc. The additional components may be formed during the fabrication of the microelectronic device 100, after the microelectronic device 100 has been fabricated, or after the formation of the microelectronic device structure 101'.

Figures 3A, 3B:
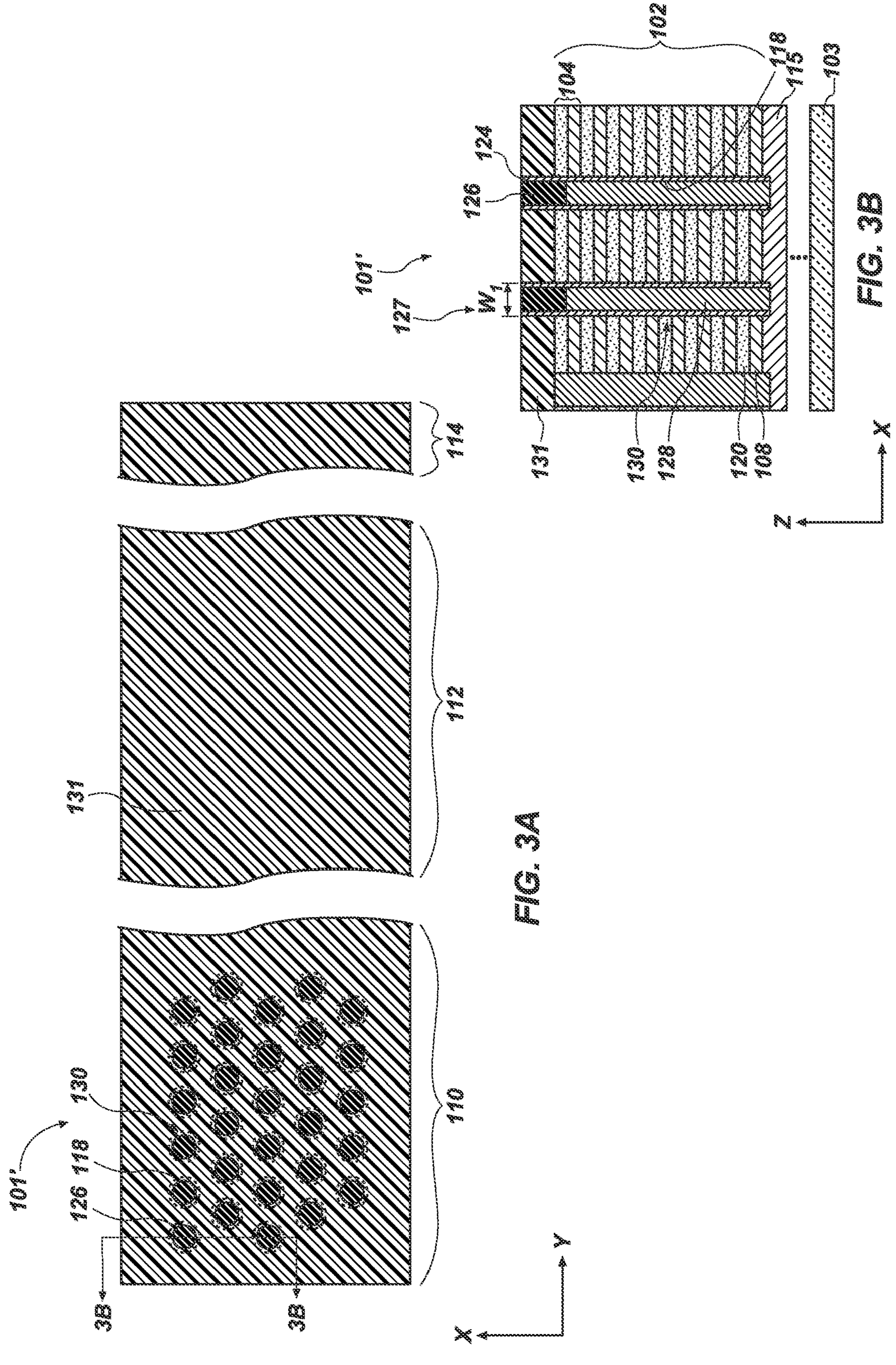
FIGS. 3A and 3B are partial cross-section and top views illustrating a method of forming a microelectronic device structure, in accordance with embodiments of the disclosure.

Referring to FIGS. 3A and 3B, a fill material 128 may be formed in remaining portions of the pillar openings 116, forming pillars 130 (e.g., memory pillars) of the microelectronic device structure 101'. The fill material 128 may be a dielectric material, such as a silicon oxide material (e.g., silicon dioxide, phosphosilicate glass, borosilicate glass, borophosphosilicate glass, fluorosilicate glass, or a combination thereof), a metal oxide material (e.g., titanium dioxide, hafnium oxide, zirconium dioxide, tantalum oxide, magnesium oxide, hafnium magnesium oxide, aluminum oxide, or a combination thereof), or a combination thereof. The fill material 128 may substantially fill (e.g., completely fill) the pillar openings 116 in which the pillars 130 are formed. A portion of the fill material 128 may be removed, such as by an etch process, forming recesses into which adjacent plugs 127 of a conductive material 126 are formed. Alternatively, the fill material 128 may only partially fill the pillar openings 116, and the conductive material 126 of the plugs 127 may be formed vertically adjacent to the fill material 128 in the remaining portions of the pillar openings 116. The pillars 130 include the fill material 128 surrounded by the channel material and cell materials 124.

The conductive material 126 of the plugs 127 may be formed of multiple, different conductive materials (e.g., metal alloys), and are substantially homogeneous in material composition (e.g., metal used to form alloys are uniformly distributed throughout the plug structure). Alternatively, the plugs 127 may be formed of a single conductive material, and are substantially homogenous in material composition. In additional embodiments, the plugs 127 are formed of multiple, different conductive materials, and are substantially heterogeneous in material composition (e.g., layered, doped, etc.). In some embodiments, the conductive material 126 of the plugs 127 is one or more of a conductively-doped polysilicon material, titanium, titanium nitride (TiN), tungsten, and combinations thereof. An isolation material (not shown) may partially surround, or at least may be formed on an uppermost surface, of the plugs 127.

In some embodiments, a first cap dielectric material 131 is formed to electrically isolate conductive materials from one another (e.g., plugs 127 from other plugs and/or other conductive structures overlying the stack 102). The first cap dielectric material 131 may be formed over each of the array region 110, the EOA region 112, and the periphery region 114. Alternatively, the first cap dielectric material 131 may be formed over one or two or more of the regions 110, 112, or 114 of the microelectronic device structure 101'. The first cap dielectric material 131 may also be referred to herein as a cap oxide or a cap oxide material.

Figures 1, 4A, 4B:
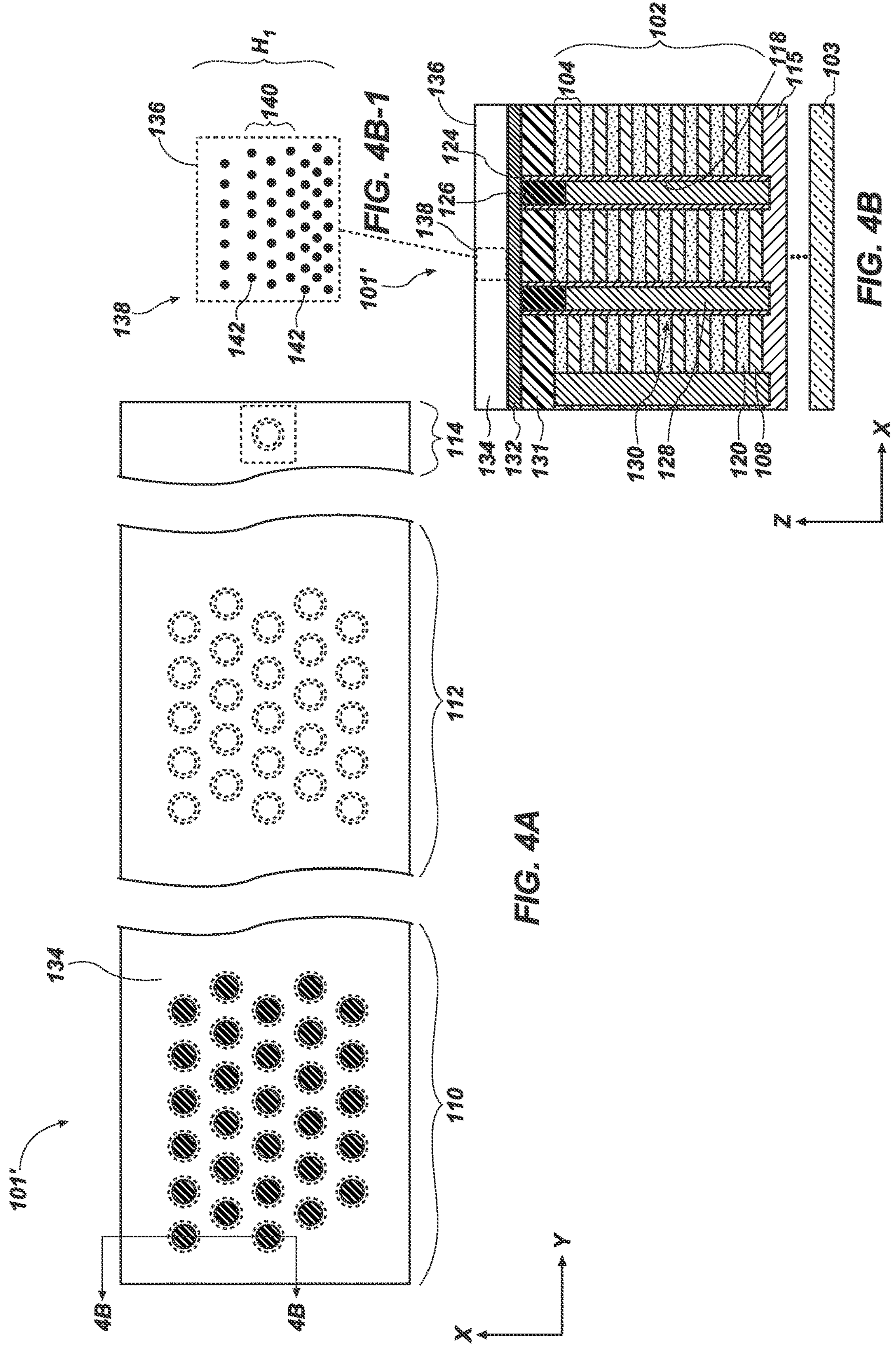
FIGS. 4A through 4B-6 are partial cross-section and top views illustrating a method of forming a microelectronic device structure, in accordance with embodiments of the disclosure.

Referring to FIGS. 4A and 4B, the microelectronic device structure 101' may include a barrier material 132 formed vertically adjacent the first cap dielectric material 131. The barrier material 132 may be formulated as an etch stop material. The barrier material 132 may be substantially homogeneous in material composition, or the barrier material 132 may be heterogeneous in material composition. The barrier material 132 may be formed of an insulative material, such as a nitride material or an oxide material. By way of example only, the barrier material 132 may be silicon nitride, silicon oxide, a carbon nitride material ($CN_x$), or combinations thereof. In some embodiments, the barrier material 132 is formed of and includes a carbon nitride material ($CN_x$).

A second cap dielectric material (e.g., a doped cap dielectric material 134) may be formed vertically adjacent the barrier material 132. In some embodiments, the doped cap dielectric material 134 is directly adjacent the barrier material 132. The doped cap dielectric material 134 may include a doped oxide material, such as a doped silicon oxide material. The dopant may be phosphorous, boron, carbon, nitrogen, or a combination thereof. Therefore, the doped silicon oxide material may include, but is not limited to, a phosphorus doped silicon oxide material, and a boron doped silicon oxide material, or a boron and phosphorous doped silicon oxide material. The doped cap dielectric material 134 may be a silicate glass, such as a boron doped silicate, a phosphorous doped silicate, or a boron phosphosilicate (BPSG). In some embodiments, the doped cap dielectric material 134 is BPSG.

The doped cap dielectric material 134 is formed to electrically isolate conductive materials from one another, such as electrically isolating conductive interconnects from other conductive materials (e.g., conductive structures). The doped cap dielectric material 134 may be vertically adjacent to the conductive structures (e.g., surrounding the conductive structures). The doped cap dielectric material has a height $H_1$.

Figures 6A, 6B:
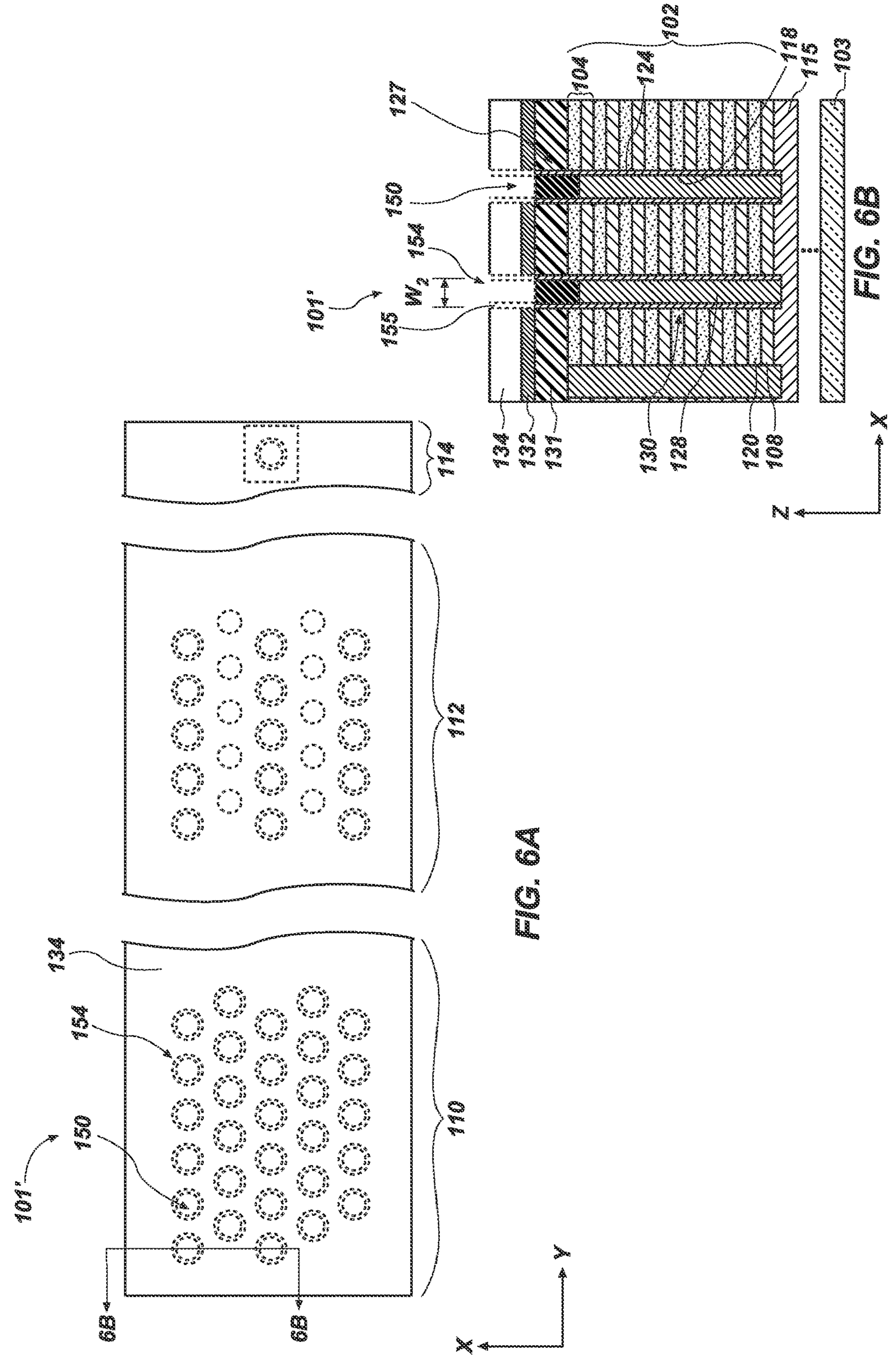
FIGS. 6A and 6B are partial cross-section and top views illustrating a method of forming a microelectronic device structure, in accordance with embodiments of the disclosure.

The doped cap dielectric material 134 may include one or more dopants to facilitate material removal acts that occur to form openings in the doped cap dielectric material 134 (see FIG. 6B). The one or more dopants are heterogeneously distributed in the doped cap dielectric material 134. The one or more dopants may be present in the doped cap dielectric material 134 as a gradient (e.g., a continuous gradient, a stepped gradient) or in one or more discrete regions of the doped cap dielectric material 134. For example, at a base region (i.e., a lower vertical region of the doped cap dielectric material 134) there may be a first dopant concentration, and at a second region vertically adjacent to the base region, there may be a second dopant concentration, or a third dopant concentration, and so on and so forth, until an upper region (i.e., vertically highest region of the doped cap dielectric material 134) is formed having a final dopant concentration that is different from one or more of the first, second, third, and other dopant concentrations. The discrete regions of the doped cap dielectric material 134 may include dopant concentrations that are different than dopant concentrations of one or more of the other regions.

Referring to FIG. 4B-1, as shown by dashed box 138, which is an enlarged view of a portion of the doped cap dielectric material 134, the doped cap dielectric material 134 may include a higher dopant concentration proximal to the barrier material 132 and a lower dopant concentration distal to the barrier material 132, as indicated by the relative distribution of first dopant 142. The doped cap dielectric material 134 may comprise a first dopant concentration at about a mid-region 140 (i.e., about mid-way between an upper surface of the barrier material 132 and an upper surface 136 of the doped cap dielectric material 134) of the doped cap dielectric material 134. A second dopant concentration vertically beneath the mid-region 140 may be greater than the first dopant concentration at the mid-region 140, while a third dopant concentration above the mid-region 140 may be less than the first dopant concentration at the mid-region 140. Although the dopant concentrations are described as proceeding from a relatively lower concentration distal to the barrier material 132 to a relatively higher concentration proximal to the barrier material 132, this dopant concentration orientation may be adjusted (e.g., reversed). For example, a relatively higher dopant concentration may be positioned above or within the mid-region 140, or a relatively lower dopant concentration may be positioned beneath or within the mid-region 140. Alternatively, the third dopant concentration above the mid-region 140 may be the same as another dopant concentration of another region (e.g., the mid-region 140, below the mid-region 140, etc.) as long as at least one of the other regions includes a different dopant concentration, so that the dopant distribution differs along a height of the doped cap dielectric material 134.

The dopant distribution of the doped cap dielectric material 134 may be achieved by adjusting a formation parameter, such as dopant flow rate, silicon precursor flow rates, oxygen precursor flow rate, or combinations thereof, relative to a vertical height of the doped cap dielectric material 134 to achieve the desired dopant profile. Additional adjustments, such as to process conditions (e.g., pressure), may occur alone or in combination with adjustments to the formation parameters during the formation of the doped cap dielectric material 134 to distribute the dopant in the doped cap dielectric material 134. By varying the process conditions and/or formation parameters as the doped cap dielectric material 134 is formed, a continuous gradient of a single first dopant 142 is achieved, as shown in FIG. 4B-1, with a higher dopant concentration proximal to the barrier material 132 and a lower dopant concentration distal to the barrier material 132.

Figures 2, 3, 4, 4B, 5, 6:
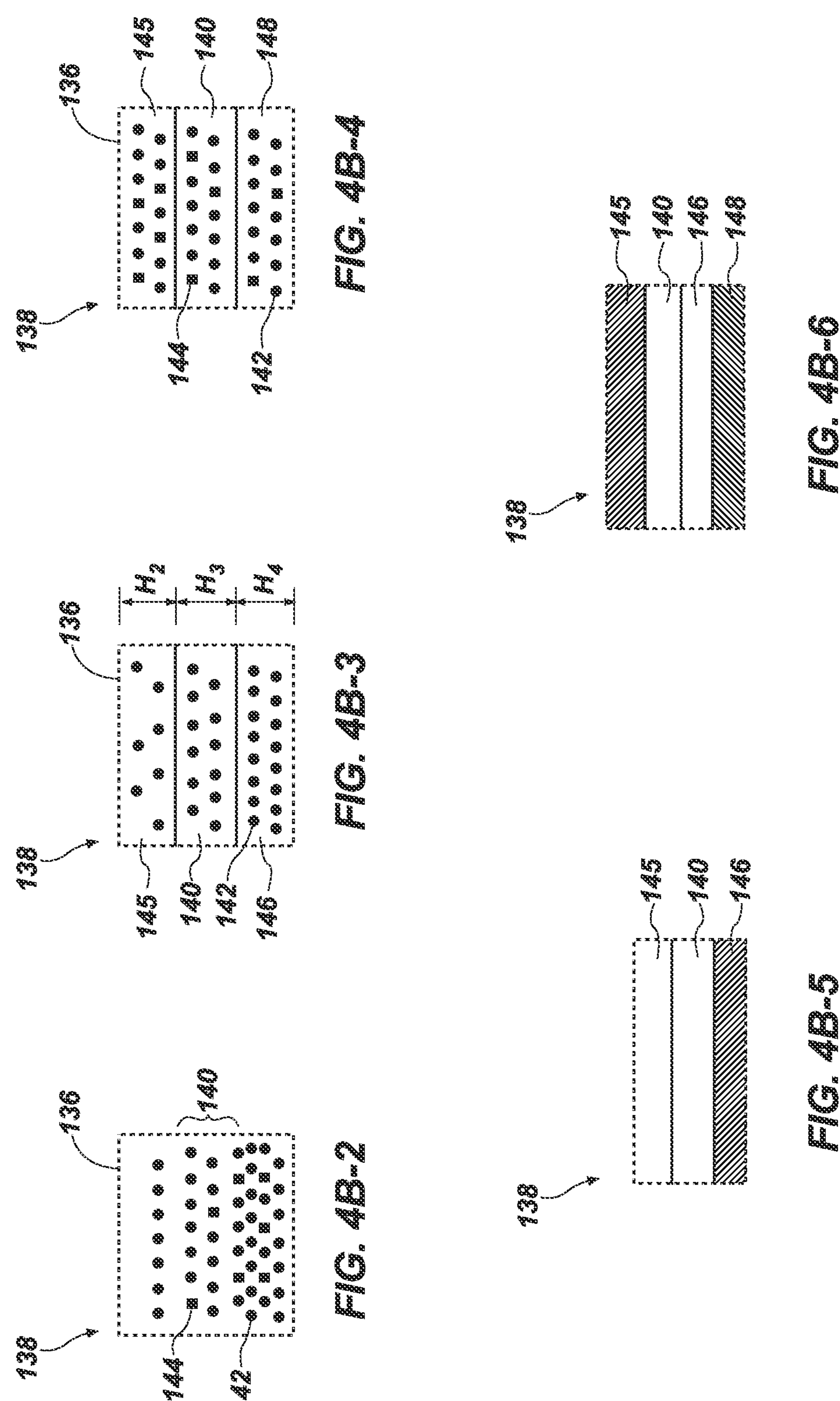

Alternatively, the doped cap dielectric material 134 may include two or more dopants, such as the first dopant 142 and a second dopant 144, as shown in FIG. 4B-2. The first dopant 142 and the second dopant 144 may be distributed throughout the doped cap dielectric material 134, with relative amounts of the first dopant 142 and the second dopant 144 being different proximal to the barrier material 132 and distal to the barrier material 132. The first dopant 142 and the second dopant 144 may be heterogeneously distributed in the doped cap dielectric material 134.

As shown in FIGS. 4B-3 through 4B-6, the doped cap dielectric material 134 may include multiple, discrete regions 145, 140, 146 including different concentrations of one or more dopants. The regions, in combination, form the doped cap dielectric material 134. As shown in FIG. 4B-3, the regions, in combination, may result in the doped cap dielectric material 134 including the gradient of the first dopant. By way of example only, an upper region 145 of the doped cap dielectric material 134 may contain the first dopant 142 at a first concentration, the mid-region 140 may contain the first dopant 142 at a second concentration, and a lower region 146 may contain the first dopant 142 at a third concentration, with one or more of the regions containing different dopant concentrations. The upper region 145 may have a height $H_2$, the mid-region 140 may have a height $H_3$, and the lower region 146 may have a height $H_4$, with the combined heights equal to the total height $H_1$. The $H_2$, $H_3$, $H_4$ may be equal to one another or may be different from one another. The change in dopant concentration between the regions 145, 140, 146 may be about two times greater, three times greater, four times greater, or five times greater.

As shown in FIG. 4B-4, the doped cap dielectric material 134 may include the multiple regions with the first dopant 142 and the second dopant 144 in at least one of the regions. By way of example only, the upper region 145 may contain the first and second dopants 142, 144 at a first concentration, the mid-region 140 may contain the first and second dopants 142, 144 at a second concentration, and the lower region 146 may contain the first and second dopants 142, 144 at a third concentration, with different relative concentrations of the first and second dopants 142, 144 in the regions. The upper region 145 may include different concentrations of one or more of the first dopant 142 and the second dopant 144 relative to one or more of the mid-region 140 and the lower region 146. For example, the combination of discrete regions 145, 140, 146 may result in the gradient of the doped cap dielectric material 134. If the first dopant 142 is present in the first discrete region 145 of the doped cap dielectric material 134, the first dopant 142 may be present at different (e.g., two or more) concentrations in one or more of the additional discrete regions 140, 146 of the doped cap dielectric material 134.

As shown in FIG. 4B-5, the doped cap dielectric material 134 may include the multiple regions 145, 140, 146, with each of the regions 145, 140, 146 exhibiting a dopant(s) concentration or a gradient of the dopant(s). For example, the upper region 145 may include a first dopant concentration or a first gradient of the dopant, while the mid-region 140 and the lower region 146 may include respective second or third dopant concentrations or second or third gradients of the dopant. The second or third dopant concentrations or the second or third dopant gradients may be the same as one another or different. The lower region 146 may, for example, have a higher dopant concentration, as indicated by the darker shading, than either of the mid-region 140 or the upper region 145, which is indicated by no shading. In some embodiments, the dopant concentration of the regions 145, 140, 146 progressively decreases from the lower region to the upper region. However, a relative orientation or position of the dopant concentration in the regions 145, 140, 146 may be changed. The mid-region 140 or the upper region 145 may exhibit the same dopant(s) concentration as one another or a different dopant(s) concentration.

Although three regions 145, 140, 146 are depicted in FIGS. 4B-3 through 4B-5, greater or fewer (e.g., two) regions of the doped cap dielectric material 134 may be present, with each of the regions exhibiting a single dopant(s) concentration or a gradient of the dopant(s). As shown in FIG. 4B-6, four regions 145, 140, 146, 148 are present, with the upper region 145 and a lowest region 148 having a higher dopant concentration(s) or a higher gradient of the dopant(s), as indicated by the darker shading.

While FIGS. 4B-1 through 4B-6 illustrate specific combinations of the first dopant 142 or the first dopant 142 and the second dopant 144, as well as different dopant distributions in the discrete regions 145, 140, 146, 148, additional combinations may be contemplated. Various arrangements and relative positioning and orientation of the dopant concentrations or dopant gradients of the regions of the doped cap dielectric material 134 are possible.

By way of example only, the first dopant 142 may include phosphorous, while the second dopant 144 may include boron. The dopant, whether single or multiple, may be selected based on the material removal processes (e.g., dry etch process, wet etch process) to be used to form openings (see FIG. 6B) in the doped cap dielectric material 134. The material removal process may remove a relatively higher doped region of the doped cap dielectric material 134 at a faster etch rate than a relatively lower doped region of the cap dielectric material 134 when exposed to the same etch chemistry and etch conditions.

The dopant concentration in the doped cap dielectric material 134 may be from about 0.5 atomic percent (at %) to about 50 at %, from about 0.5 at % to about 40 at %, from about 0.5 at % to about 30 at %, from about 0.5 at % to about 20 at %, or from about 0.5 at % to about 10 at %. The remaining amount of the doped cap dielectric material 134 may include from about 80 at % to about 99.5 at % silicon oxide. In some embodiments, a dopant concentration is from about 25 at % to about 50 at %. In other embodiments, the dopant concentration is from about 0.5 at % to about 20 at %. If more than one dopant is present, the total dopant concentration (e.g., a combined dopant concentration of the first dopant 142 and the second dopant 144) may be from about 0.5 at % to about 20 at % of the doped cap dielectric material 134, with the remaining from about 80 at % to about 99.5 at % being primarily silicon oxide.

To achieve the desired etch selectivity between the regions of the doped cap dielectric material 134, a difference in dopant concentration of from about 2 times to about 6 times may be present between the regions of the doped cap dielectric material 134. By way of example only, the concentration of the dopant in a region proximal to the barrier material 132 may be about three times more concentrated relative to the concentration of the dopant in a region distal to the barrier material 132. If multiple dopants are present, the dopant concentrations of the first dopant 142 relative to the second dopant 144 may be from about two times (e.g., 2×), 3×, 4×, 5×, 6× or more of the first dopant 142 as compared to the second dopant 144. In some embodiments, there is at least about two times as much first dopant 142 as there is second dopant 144 in the doped cap dielectric material 134.

The doped cap dielectric material 134 may be formed by conventional techniques, with the one or more dopant being incorporated in the doped cap dielectric material 134 during deposition. In other words, the dopant is not included in the doped cap dielectric material 134 by an implantation process. The doped cap dielectric material 134 may be formed using an oxygen precursor compound, a silicon precursor compound (e.g., a silane precursor, tetraethylorthosilicate (TEOS)), and a dopant source, such as a dopant compound. By way of example only, a phosphorous dopant compound may be triethyl phosphate $(C_2H_5)_3PO_4$, and a boron dopant compound may be triethyl borane $(C_2H_5)_3B$. The desired dopant profile of the doped cap dielectric material 134 may be achieved by adjusting the formation parameters and/or process conditions of a deposition tool used to form the doped cap dielectric material 134. The doped cap dielectric material 134 may be formed using a single deposition tool. The formation parameters and/or process conditions may include, but are not limited to, a flow rate of the dopant compound, a flow rate of the oxygen precursor compound, a flow rate of the silicon precursor compound, pressure, temperature, or combinations thereof. For example, the flow rate of the dopant compound may initially be a relatively high flow rate relative to the flow rates of the oxygen precursor compound and the silicon precursor compound. The dopant flow rate may subsequently be decreased, while maintaining or increasing the flow rates of the oxygen precursor compound and the silicon precursor compound to form the regions of the doped cap dielectric material 134 proximal to the barrier material 132 exhibiting a higher concentration of the dopant than the regions of the doped cap dielectric material 134 distal to the barrier material 132. Alternatively, different tools may be used to form different regions of the doped cap dielectric material 134 (e.g., different regions of the same or different dopant concentrations or gradients in each region). In these embodiments, the parameters may include but are not limited to, deposition type (e.g., ALD, CLD, PEALD, etc.), growth mechanism, precursors used, dopant types, dopant flow rates, pressures, temperatures, and combinations thereof.

The presence of the dopant in the doped cap dielectric material 134 may enable portions of the doped cap dielectric material 134 to be selectively removed (e.g., selectively etched) relative to additional portions of the doped cap dielectric material 134. For instance, a region of the doped cap dielectric material 134 having a relatively higher concentration of the dopant may exhibit a higher etch rate relative to an etch rate of a region of the doped cap dielectric material 134 having a relatively lower concentration of the dopant. Therefore, the region of the doped cap dielectric material 134 having the relatively higher dopant concentration may be selectively removed relative to one or more regions of the doped cap dielectric material 134 having the relatively lower dopant concentration.

Figures 5A, 5B:
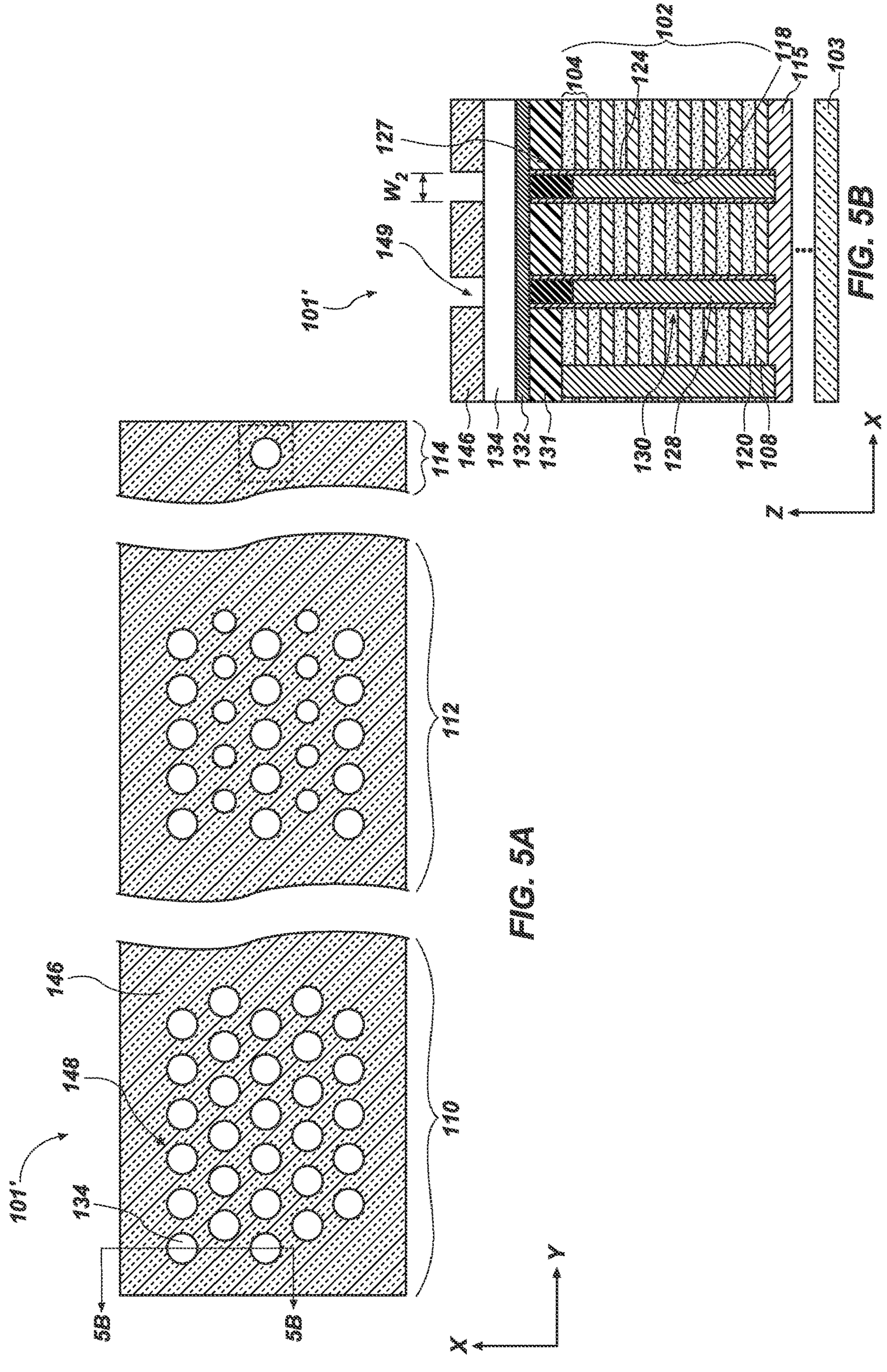
FIGS. 5A and 5B are partial cross-section and top views illustrating a method of forming a microelectronic device structure, in accordance with embodiments of the disclosure.

Referring to FIGS. 5A and 5B, a hard mask material 146 may be formed adjacent the doped cap dielectric material 134 by conventional techniques. The hard mask material 146 may be a doped hard mask material (e.g., a boron-doped hard mask material), a carbon hard mask material, or other hard mask material. In some embodiments, the hard mask material 146 is formed of and includes one or more of amorphous carbon and doped amorphous carbon (e.g., boron-doped amorphous carbon, such as boron-doped amorphous carbon comprising at least 1 weight percent (wt %) boron and at least 20 wt % carbon, such as between about 1 wt % boron and about 40 wt % boron, and between about 99 wt % carbon and about 60 wt % carbon). In other embodiments, the hard mask material 146 is a boron-doped hard mask material. In additional embodiments, the hard mask material 146 is a carbon hard mask material. The hard mask material 146 may be patterned by conventional photolithography and etching techniques to form openings 149. A width $W_2$ of the openings 149 is less than a CD (e.g., $W_1$) of the pillars 130 (see FIG. 1B) previously formed. The pattern of the hard mask material 146 may include linear and/or non-linear features and linear and/or non-linear openings 149 and may be formed using positive photoresist materials or negative photoresist materials.

The pattern of the hard mask material 146 is transferred to the doped cap dielectric material 134, exposing the barrier material 132, as shown in FIGS. 6A and 6B. Openings 154 (e.g., contact structure openings) are formed through the doped cap dielectric material 134 and the barrier material 132 using the patterned hard mask material 146 as a mask. The openings 154 may be formed by conducting multiple (e.g., two or more) removal acts, such as by conducting a dry etch process and one or more wet etch processes. The openings 154 may have the width, $W_2$, that is less than or substantially equal to the width, $W_1$, of the pillars 130. The dry etch process may be conducted to form initial openings 150, which are formed by the removal of a first portion of the doped cap dielectric material 134. The one or more wet etch processes are subsequently conducted to remove additional portions of the doped cap dielectric material 134 to form the openings 154. The removal conditions (e.g., etch chemistry, etch conditions) may be selected based on the materials used as the hard mask material 146 and the doped cap dielectric material 134. The resulting openings 154 exhibit a smaller CD and a desired sidewall profile compared to conventional methods of forming similar openings. Since the dry etch process is used to remove only the first portion of the doped cap dielectric material 134, overetch of the doped cap dielectric material 134 may be reduced. The subsequently conducted wet etch process(es) may remove the additional portions of the doped cap dielectric material 134 without overetching the doped cap dielectric material 134.

The initial openings 150 may be formed, for example, adjacent to (e.g., vertically adjacent to, over) the plugs 127 by removing the first portion of the doped cap dielectric material 134 and the barrier material 132 by the dry etch process (e.g., reactive ion etch (RIE)). The removal conditions may be selected based on the materials used as the hard mask material 146, the doped cap dielectric material 134, and/or the conductive materials 126 of the plugs 127. During the reactive ion etch process, the conductive material 126 of the plugs 127 may, for example, function as an etch stop material. A width of the initial openings 150 may be less than the width $W_1$ of the pillars 130.

After forming the initial openings 150, the second removal act may be conducted to remove the additional portions of the doped cap dielectric material 134 and the barrier material 132 by the one or more wet etch processes. The additional portions of the doped cap dielectric material 134 and the barrier material 132 adjacent to the plugs 127 are removed so that the width $W_2$ of the openings 154 is less than or substantially equal to the width $W_1$ of the pillars 130. The removal conditions may be selected based on the materials used as the hard mask material 146, the doped cap dielectric material 134, and/or the conductive materials 126 of the plugs 127. By conducting the wet etch process, the width of the initial openings 150 formed by the dry etch process may be adjusted (e.g., increased) to the width $W_1$ of the pillars 130 or to the width $W_2$ of the hard mask openings 149. The additional portions may be removed in a vertical direction, a horizontal direction, or a vertical and a horizontal direction. The wet etchant may comprise one or more of hydrofluoric acid (HF), a buffered oxide etchant (BOE), and nitric acid ($HNO_3$) depending on the one or more dopants present in the doped cap dielectric material 134. In some embodiments, the wet etchant comprises a solution of water and HF at a ratio within a range of from about 500:1 water:HF to about 100:1 water:HF. In other embodiments, the wet etchant comprises a buffered oxide etch (BOE). The wet etchant may be selected based on the one or more dopants present in the doped cap dielectric material 134 and the dopant profile.

Regions of the doped cap dielectric material 134 including a higher concentration of the dopant may be removed at a faster rate by the wet etch process than other regions of the doped cap dielectric material 134. By way of example only, if the doped cap dielectric material 134 includes a gradient of the dopant, with the higher dopant concentration proximal to the barrier material 132, the doped cap dielectric material 134 proximal to the barrier material 132 may be removed at a faster etch rate than the doped cap dielectric material 134 distal to the barrier material 132. After forming the openings 154, the hard mask material 146 may, optionally, be removed.

Therefore, the first removal act (e.g., the dry etch process) may be a more precise material removal process than the second removal act (e.g., the wet etch process). Using the two or more etch processes may facilitate a desired profile of the sidewalls 155 (e.g., substantially vertical, tapered, etc.) as well as a desired CD of contact structures 158 (see FIGS. 7A and 7B). Etch conditions of the dry etch process and of the wet etch process may be selected depending on the dopant profile of the doped cap dielectric material 134.

In some embodiments, the sidewalls 155 of the doped cap dielectric material 134 are substantially vertical and may be substantially aligned with the sidewalls 118 of the pillars 130 after conducting the first and second removal acts. A lower portion (e.g., proximal to the first cap dielectric material 131) of the sidewalls 155 may be substantially vertically aligned with the sidewalls 118 and an upper portion (e.g., distal to the first cap dielectric material 131) of the sidewalls 155 may be substantially vertically aligned with the lower portion. For instance, if the doped cap dielectric material 134 includes the higher dopant concentration proximal to the barrier material 132, the sidewalls 155 may be substantially vertical following the two material removal processes because the more highly doped region of the doped cap dielectric material 134 is removed at a faster etch rate than the less highly doped region of the doped cap dielectric material 134. Therefore, the profile of the sidewalls 155 of the doped cap dielectric material 134 may be less tapered than the sidewalls of a cap dielectric material of a conventional electronic device.

In other embodiments, the width of the openings 154 laterally adjacent to the doped cap dielectric material 134 may be less than the width $W_1$ of the pillars 130, and the sidewalls 155 of the doped cap dielectric material 134 may be substantially vertical or may be sloped (e.g., tapered). The profile or taper of the sidewalls 155 of the doped cap dielectric material 134 may depend on an amount of time the wet etch process is conducted, the etch chemistry used, and the material composition and dopant profile of the doped cap dielectric material 134. For example, depending on the amount of time and the process conditions used, the sidewalls 155 of the doped cap dielectric material 134 may be curved (not shown), sloped (see FIG. 7-1B), or substantially vertical (see FIG. 7B). As described below, a conductive material 156 may be formed in the openings 154.

By forming the openings 154 in separate removal acts, the width of the openings 154 may be substantially similar to or less than the CD of the pillars 130 proximal to the plugs 127, while also maintaining the desired alignment of the openings 154 relative to the plugs 127 and the pillars 130. A dimension of a lower portion of the openings 154 (i.e., a width closest in proximity to the plugs 127) may be small (e.g., less than $W_1$), while an upper dimension of the openings 154 (i.e., a width distal from the plugs 127) may also remain relatively small, resulting in the sidewalls 155 being substantially vertical. Therefore, after conducting the first and second removal acts, the widths of the openings 154 proximal to the plugs 127 and distal to the plugs 127 may be substantially the same as one another. Using the doped cap dielectric material 134 and conducting the two material removal processes according to embodiments of the disclosure results in a decrease in width of the openings 154 of from about 30% to about 40% compared to the width of cap dielectric openings formed using conventional techniques (i.e., lacking a doped dielectric material composition adjacent to the cap dielectric openings).

In other words, using at least two separate material removal acts (e.g., etch acts) according to embodiments of the disclosure to form the openings 154 in the doped cap dielectric material 134 provides greater control over the dimensions of the openings 154. The greater control enables decreased dimensions (e.g., diameters) of the openings 154 relative to microelectronic device structures that are formed using conventional techniques (e.g., microelectronic device structures lacking the doped cap dielectric material 134 vertically adjacent to the conductive structures). Therefore, an amount of overetch occurring relative to the dimensions of the openings 154 may be reduced. The decreased dimensions of the openings 154 also increases the process margin for subsequently conducted process acts (e.g., filling the openings 154 with conductive materials).

In conventional processes, a cap dielectric material is formed of a dielectric material (e.g., a single dielectric material lacking a dopant, an undoped cap dielectric material) and larger opening dimensions are present in the cap dielectric material because the undoped cap dielectric material is etched at a faster rate towards the top portion of the openings than at the bottom portion of the openings. The larger dimension openings formed in the undoped cap dielectric material using conventional techniques also have increased probability of misalignment. When conductive material is subsequently used to fill the openings, the conductive material undesirably connects (e.g., shorts) with underlying word lines due to the larger dimension cap dielectric openings. In contrast, the use of the two separate material removal acts according to embodiments of the disclosure, together with other features discussed herein, cures these deficiencies of conventional microelectronic device formation due to the increased controllability provided by the two material removal acts.

Additional material removal acts, such as a third material removal act, a fourth material removal act, a fifth material removal act, etc., relative to the doped cap dielectric material 134, may optionally be performed to selectively remove further portions of the doped cap dielectric material 134 based on differences in etch selectivity. For example, the optional additional material removal act(s) may be performed to increase a horizontal dimension of the openings 154, increase a volume of the openings 154, or obtain a desired shape of the openings 154 in which the conductive material is subsequently formed.

Figures 7A, 7B:
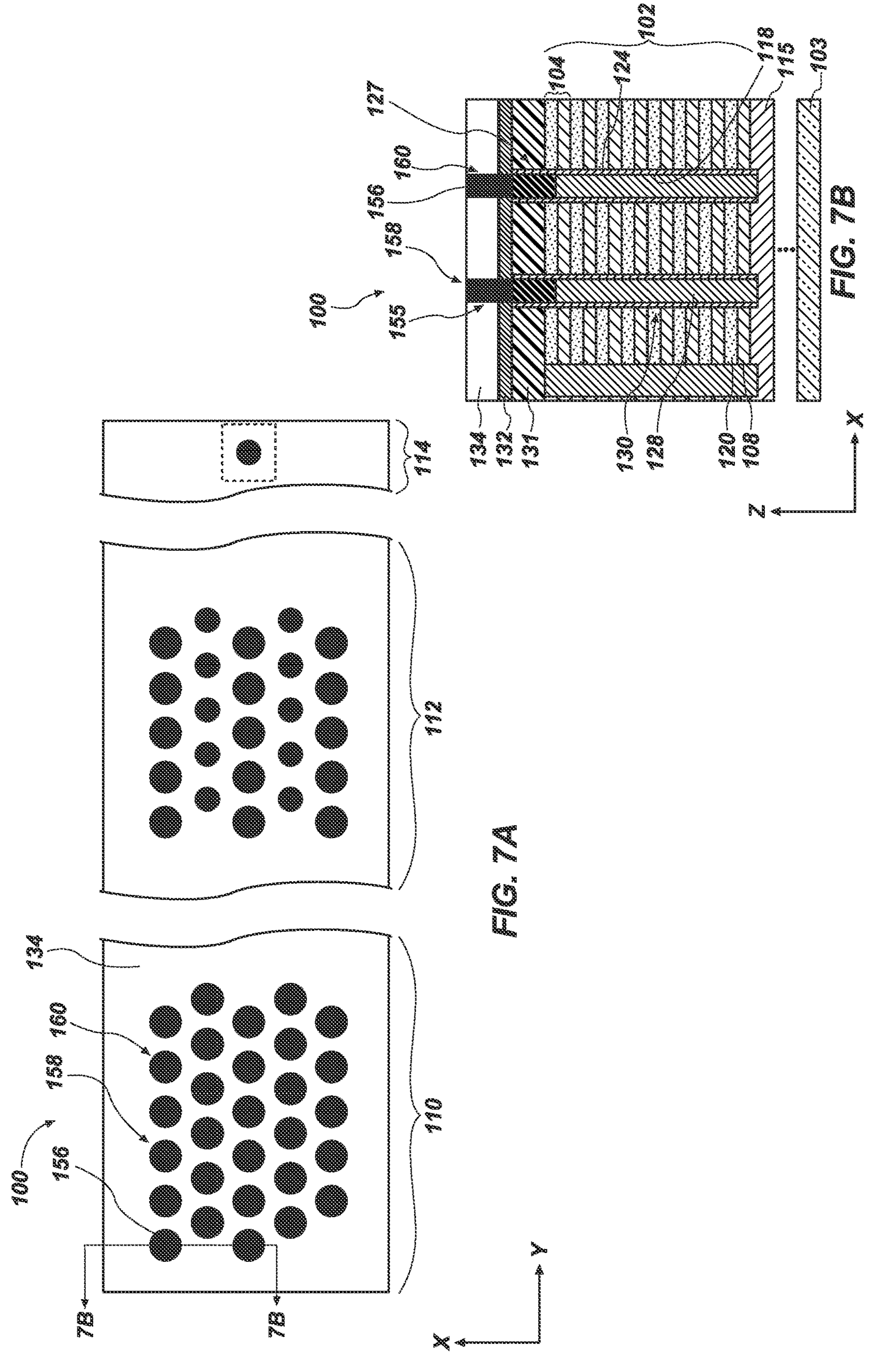

Referring to FIGS. 7A and 7B, a conductive material 156 may be used to form contact structures 158 (e.g., contacts, bit line contacts, interconnect structures) adjacent to (e.g., on or over) the plugs 127. The conductive material 156 of the contact structures 158 may be formed in the openings 154 using one or more conventional processes (e.g., conventional deposition processes). The conductive material 156 may be formed (e.g., deposited) in the openings 154, and excess portions of the conductive material 156 overlying an upper surface of the doped cap dielectric material 134 may be removed (e.g., through a CMP process) to form the contact structures 158 of the microelectronic device 100.

As shown in FIG. 7B, the sidewalls 160 of the contact structures 158 may be substantially vertically aligned with the sidewalls of the pillars 130 and may be substantially vertical. The width of the contact structures 158 may also be substantially the same as the width $W_1$ of the pillars 130. Therefore, misalignment between the plugs 127 and the contact structures 158 may be reduced. Alternatively, the width of the contact structures 158 may be less than the width of the pillars 130 (i.e., if the width $W_2$ of the openings 154 is less than the width $W_1$ of the pillars 130), and the resulting contact structures 158 may exhibit substantially vertical sidewalls that are parallel to the sidewalls of the pillars 130. The contact structures 158 may function as interconnect structures between bit lines and word lines of a microelectronic device 900 (see FIG. 9).

Figures 1A, 1B, 7:
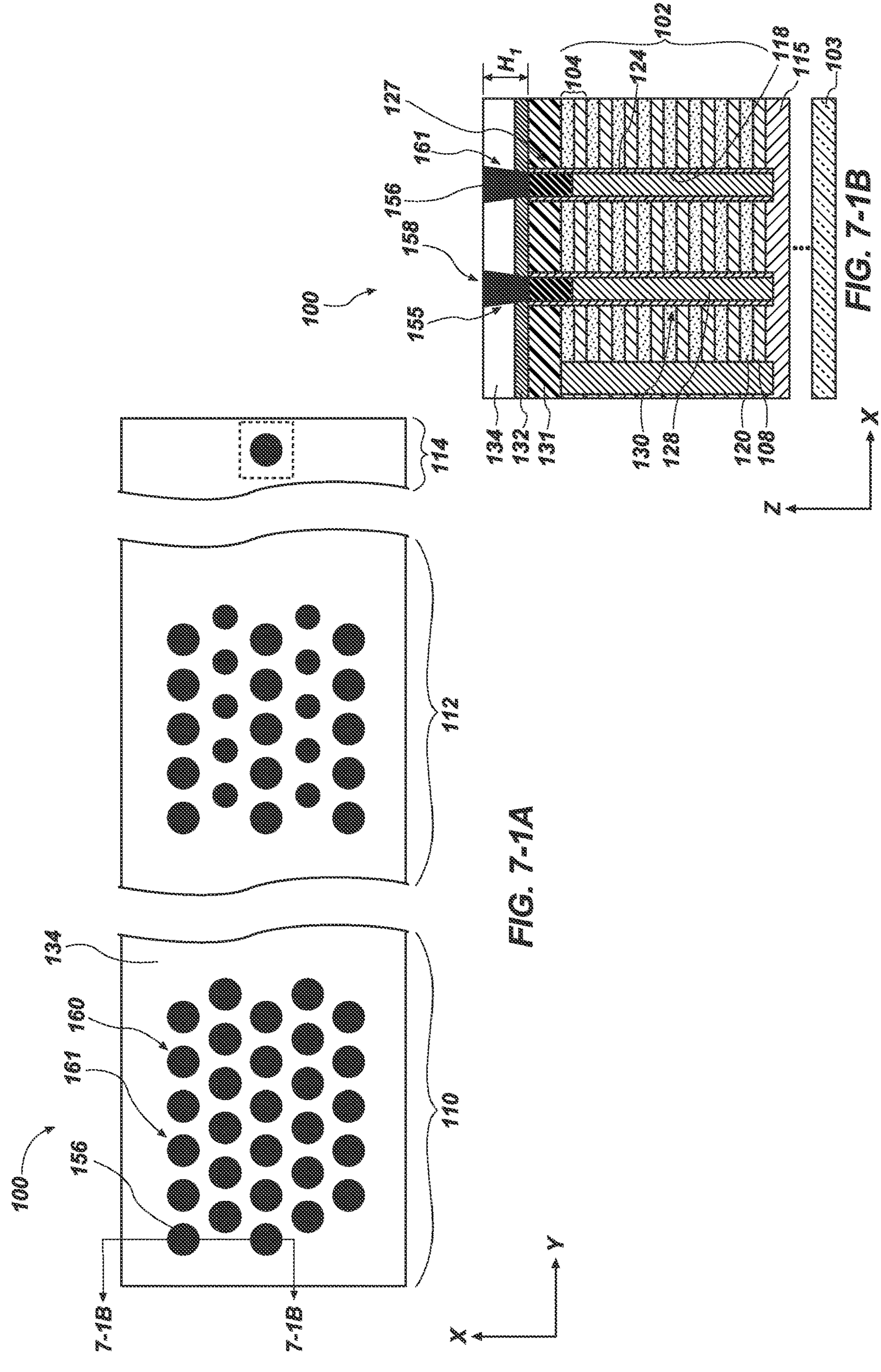

Referring to FIGS. 7-1A and 7-1B, in other embodiments, the sidewalls 161 of the contact structures 158 may be sloped (e.g., tapered) along a height, $H_1$, of the doped cap dielectric material 134 and the barrier material 132. Although the sidewalls 161 of the contact structures 158 are tapered, the extent of tapering may be significantly reduced relative to contact structures formed using conventional techniques (e.g., without a doped cap dielectric material vertically adjacent to the contact structures 158). The degree of taper of the sidewalls 161 of the contact structures 158 may be decreased by from about 5% to about 40%, such as from about 5% to about 20%, relative to the taper of contact structures formed using conventional techniques.

Since the width of the conductive structures (e.g., the contact structures 158) is less than or substantially equal to the CD of the pillars 130, the likelihood of parasitic capacitance occurring between the contact structures 158 and underlying word lines is reduced or eliminated. In addition, shorting is minimized between the contact structures 158 and the conductive materials 120 (e.g., word lines). The smaller width of the initial openings 154 in which the conductive structures are formed enables the conductive structures to directly contact the plugs 127 and reduces misalignment between the conductive structures and the plugs 127. The reduced misalignment may result in reduced shorting with underlying conductive materials 120 (e.g., word lines) of the tiers 104.

While FIGS. 1A through 7-1B illustrate the first cap dielectric material 131 between the tiers 104 and the barrier material 132, the first cap dielectric material 131 may be replaced with a material similar to the doped cap dielectric material 134. In other words, the first cap dielectric material 131 may include one or more dopants heterogeneously distributed throughout its thickness.

Accordingly, a microelectronic device is disclosed and comprises tiers of alternating dielectric materials and conductive materials, pillars extending through the tiers, and a doped dielectric material adjacent to the tiers. The doped dielectric material comprises a heterogeneous chemical composition comprising one or more dopants. Conductive contact structures are in the doped dielectric material.

Accordingly, a microelectronic device is disclosed and comprises tiers of alternating dielectric materials and conductive materials, pillars extending through the tiers, and a doped dielectric material vertically adjacent to the tiers. The doped dielectric material comprises two or more dopants heterogeneously distributed therein. An oxide material is between the tiers and the doped dielectric material, and conductive contact structures are in the doped dielectric material.

Figure 8:
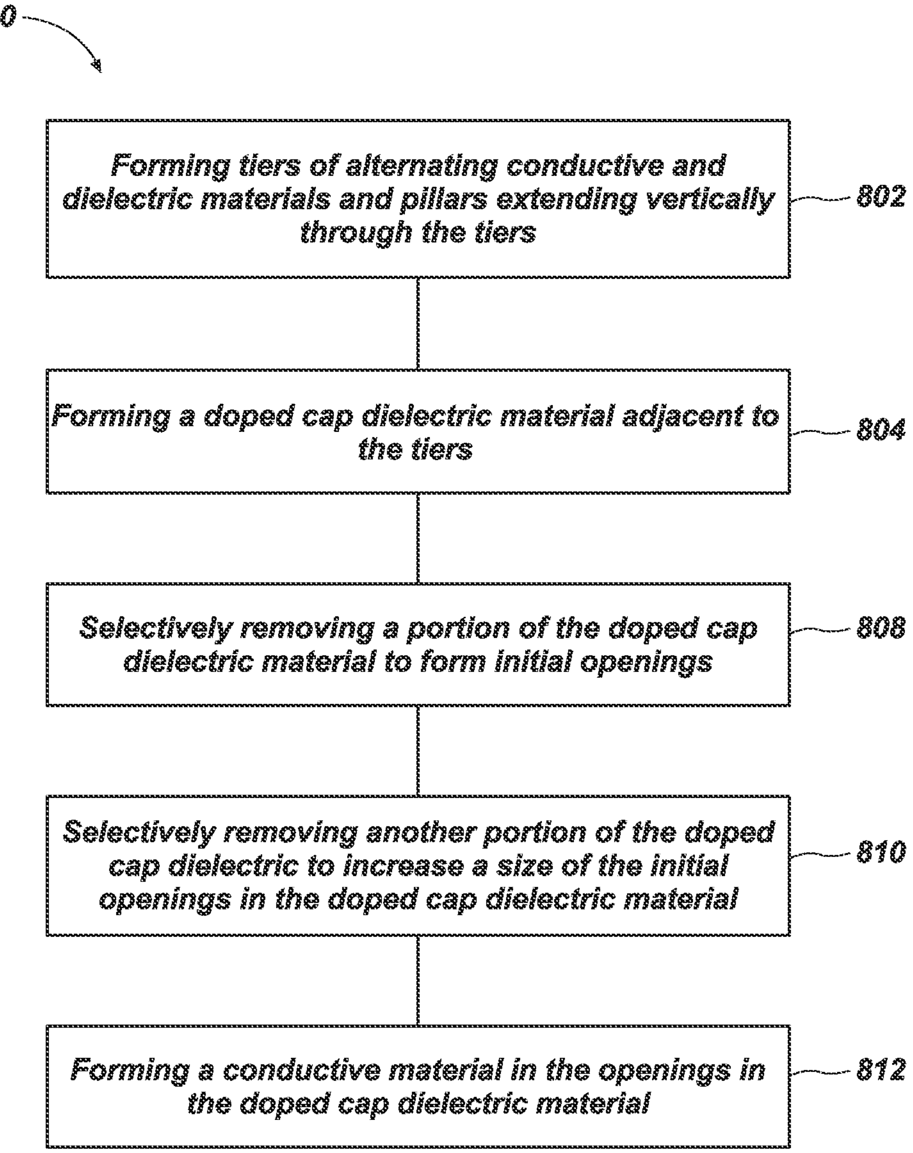
FIG. 8 is a flow diagram of a method of forming a microelectronic device structure, in accordance with embodiments of the disclosure.

Referring to FIG. 8, a method 800 of forming a microelectronic device structure includes act 802 of forming tiers of alternating conductive and dielectric materials and pillars extending vertically through the tiers. For example, the microelectronic device structure 101' including the tiers 104 may be formed as described above for FIGS. 1A and 1B.

Act 804 includes forming a doped cap dielectric material adjacent to the tiers. The act 804 of forming the doped cap dielectric material may be dependent on one or more process and/or formation parameters adjusted or controlled during the formation of the doped cap dielectric material. The process and/or formation parameters may include, but are not limited to, dopant compound flow rate, a first dopant flow rate relative to a second dopant flow rate, silicon precursor flow rate, oxide precursor flow rate, chemical bond formation, temperature, pressure, or combinations thereof. Act 804 may be repeated one or more times to form two or more different regions of the doped cap dielectric materials. For example, the doped cap dielectric material 134 may be formed adjacent to the tiers 104.

Act 808 includes selectively removing a portion of the doped cap dielectric material to form initial openings in the doped cap dielectric material. The portion of the doped cap dielectric material may be selectively removable due to a dopant concentration or dopant gradient in the doped cap dielectric material. The act 808 may include conducting a dry etch process, such as a reactive ion etch (RIE, e.g., using about 300 to 5000 watts and a RF of about 13.56 MHz). The act 808 may be limited in duration to remove only the portion of the doped cap dielectric material.

Act 810 of selectively removing an additional portion of the doped cap dielectric material is conducted to increase a size of the initial openings, forming contact structure openings in the doped cap dielectric material. The additional portion of the doped cap dielectric material may exhibit a different dopant concentration or dopant gradient than the initial portion. The removal of the additional portion of the doped cap dielectric material may be less precise (e.g., less controllable) than the act 808. For example, the act 808 may include conducting a wet etch process. The act 810 may include conducting additional material removal processes to further increase a size of the contact structure openings. For example, a first material removal process may include the dry etch process of act 808, a second material removal process may include the wet etch of act 810 to increase a vertical dimension of the initial openings, while a third material removal process may include another wet etch process to increase a horizontal or lateral dimension of a bottom or lower portion of the openings to form the contact structure openings.

Act 812 includes forming a conductive material in the contact structure openings in the doped cap dielectric material to form contact structures in the doped cap dielectric material. Due to the precision and controllability of the material removal acts 808, 810, the process margin of forming the contact structures is improved and the likelihood of parasitic capacitance between the contact structures and word lines is decreased.

Accordingly, disclosed is a method of forming a microelectronic device that includes forming tiers of alternating conductive materials and dielectric materials and pillars extending vertically through the tiers. A doped dielectric material is formed adjacent to the tiers and comprises a heterogeneous chemical composition that is formulated to exhibit different etch rates at different portions of the doped dielectric material. A portion of the doped dielectric material is removed to form openings in the doped dielectric material and an additional portion of the doped dielectric material is removed to increase a width of the openings. Conductive contact structures are formed in the openings and comprise a critical dimension that is relatively less than or equal to a critical dimension of the pillars.

Figure 9:
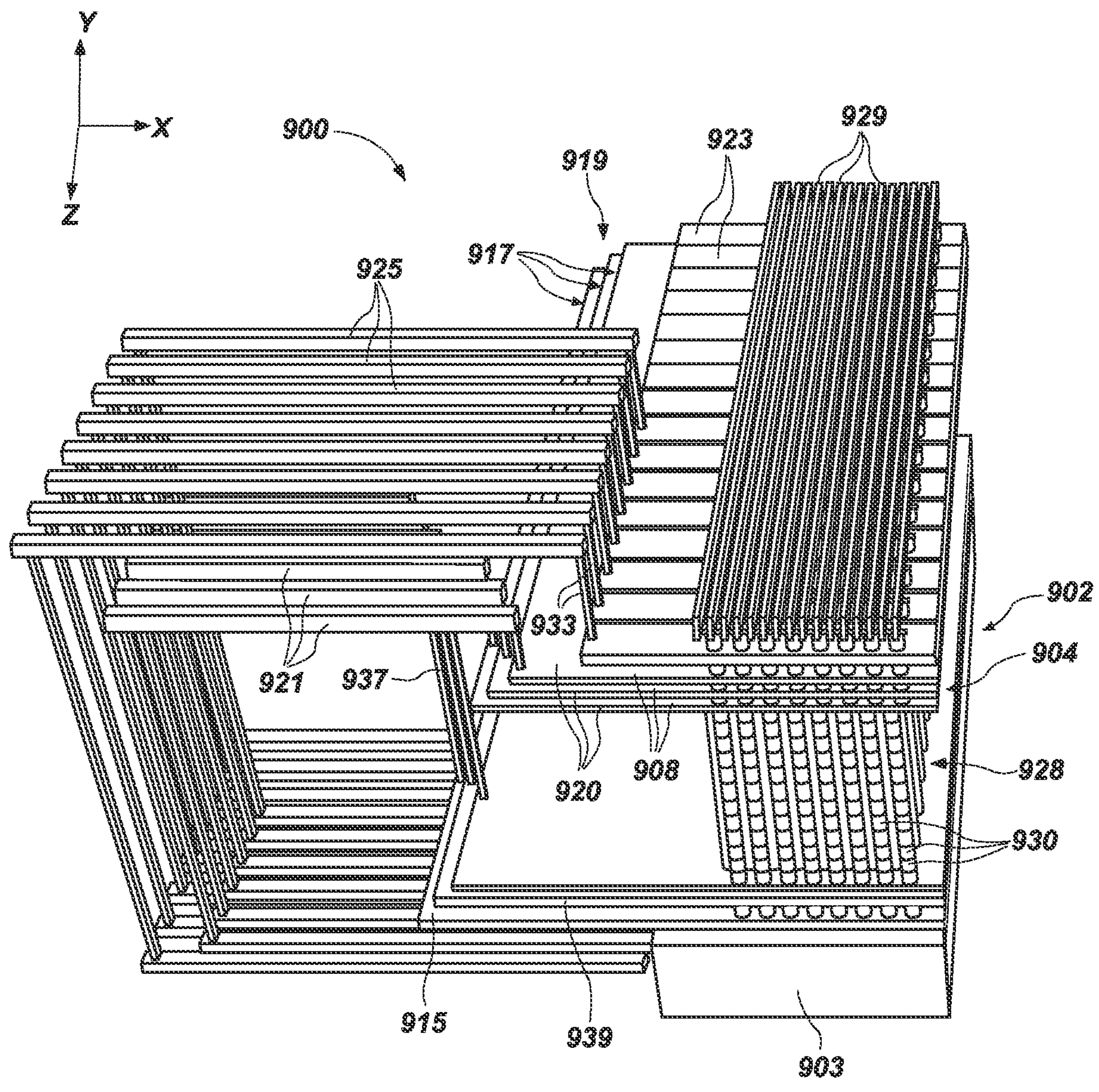
FIG. 9 is a simplified partial cutaway perspective view of a microelectronic device, in accordance with embodiments of the disclosure.

Microelectronic device structures 101' of embodiments of the disclosure may be included in microelectronic devices 100 (e.g., memory devices) of the disclosure. For example, FIG. 9 illustrates a partial cutaway perspective view of a portion of a microelectronic device 900 (e.g., a memory device, such as a 3D NAND Flash memory device) including the microelectronic device structure 101' or microelectronic device 100 at or following the processing stage previously described with reference to FIGS. 2A to 7-1B. For clarity and ease of understanding the drawings and associated description, some features (e.g., structures, materials) of the microelectronic device structure 101' or microelectronic device 100 previously described herein are not shown in FIG. 9. However, it will be understood that any features of the microelectronic device structure 101' or microelectronic device 100 at or preceding a processing stage previously described with reference to FIGS. 2A to 7-1B, and that have been described herein with reference to one or more of FIGS. 1A through 7-1B, may be included in the microelectronic device 900 described herein with reference to FIG. 9.

The microelectronic device 900 may include a microelectronic device structure 902 including a vertically alternating (e.g., in the Z-direction) sequence of conductive structures 920 and insulative structures 908 arranged in tiers 904 each including at least one of the conductive structures 920 vertically adjacent at least one of the insulative structures 908. The conductive structures 920, the insulative structures 908, and the tiers 904 may respectively correspond to the conductive structures (e.g., conductive materials 120), the insulative structures (e.g., dielectric materials 108), and the tiers 104 previously described with reference to FIGS. 2A to 7-1B. In addition, the microelectronic device 900 includes cell pillar structures 930 corresponding to the structures of the cell pillars 130 previously described with reference to FIGS. 2A to 7-1B, vertically extending through the microelectronic device structure 902. Intersections of the cell pillar structures 930 and the conductive structures 920 form strings of memory cells 928 vertically extending through the microelectronic device structure 902. The conductive structures 920 may serve as local access line structures (e.g., local word line structures) for the strings of memory cells 928. Furthermore, the microelectronic device 900 may also include one or more staircase structures 919 having steps 917 defined by edges (e.g., horizontal ends in the X direction) of the tiers 904. The steps 917 of the staircase structures 919 may serve as contact regions for the conductive structures 920.

The microelectronic device 900 may further include at least one source structure 915, access line routing structures 921, first select gates 923 (e.g., upper select gates, drain select gates (SGDs)), select line routing structures 925, one or more second select gates 939 (e.g., lower select gates, source select gate (SGSs)), digit line structures 929, access line contact structures 937, and select line contact structures 933. The digit line structures 929 may be coupled to the cell pillar structures 930 by way of additional contact structures, plug structures, and pillar contact structures. For example, the digit line structures 929 may vertically overlie and physically contact the additional contact structures; the additional contact structures may vertically overlie and physically contact the plug structures; the plug structures may vertically overlie and physically contact the pillar contact structures; and the pillar contact structures may physically contact the cell pillar structures 930 (e.g., corresponding to the cell pillars 130 (FIGS. 2A to 7-1B)). In addition, the access line contact structures 937 and the select line contact structures 933 may couple additional features of the microelectronic device 900 to one another as shown (e.g., the select line routing structures 925 to the first select gates 923, the access line routing structures 921 to the conductive structures 920 of the tiers 904 of the microelectronic device structure 902).

The microelectronic device 900 may also include a base structure 903 positioned vertically below the cell pillar structures 930 (and, hence, the strings of memory cells 928). The base structure 903 may include at least one control logic region including control logic devices configured to control various operations of other features (e.g., the strings of memory cells 928) of the microelectronic device 900. As a non-limiting example, the control logic region of the base structure 903 may further include one or more (e.g., each) of charge pumps (e.g., VCCP charge pumps, VNEGWL charge pumps, DVC2 charge pumps), delay-locked loop (DLL) circuitry (e.g., ring oscillators), $V_{dd}$ regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control logic region of the base structure 903 may be coupled to the source structure 915, the access line routing structures 921, the select line routing structures 925, and the digit line structures 929. In some embodiments, the control logic region of the base structure 903 includes CMOS (complementary metal-oxidesemiconductor) circuitry. In such embodiments, the control logic region of the base structure 903 may be characterized as having a "CMOS under Array" ("CuA") configuration. Although a CuA configuration is depicted, in other embodiments, the base structure 903 may be located above the digit line structures 929 and configured as a "CMOS over Array" ("CoA") device.

Microelectronic device structures (e.g., the microelectronic device structure 101' at or following the processing stage previously described with reference to FIGS. 2A to 7-1B) and microelectronic devices 100 (e.g., the microelectronic device 900 (FIG. 9)) in accordance with embodiments of the disclosure may be used in embodiments of electronic systems of the disclosure.

The microelectronic device 900 according to embodiments of the disclosure may include, but is not limited to, a 3D electronic device, such as a 3D NAND Flash memory device, such as a multideck 3D NAND Flash memory device. The microelectronic device 900 formed according to embodiments of the disclosure may be used in any 3D microelectronic device where reduced or eliminated pillar misalignment is desired.

Figure 10:
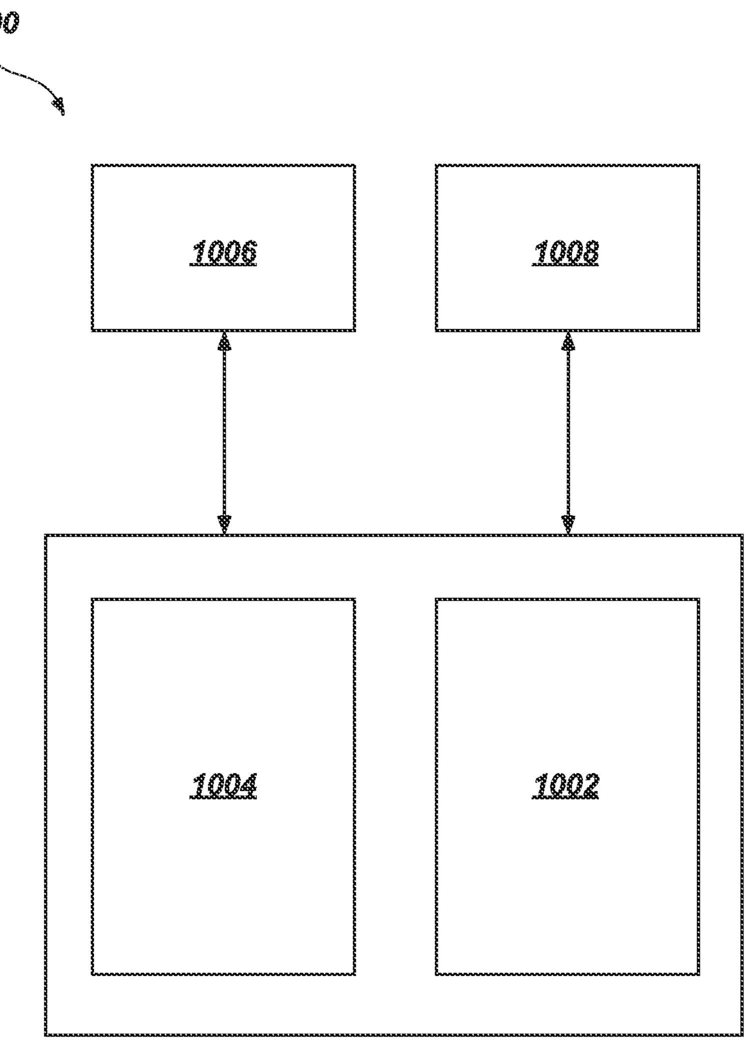
FIG. 10 is a schematic block diagram illustrating a microelectronic system, in accordance with embodiments of the disclosure.

For example, FIG. 10 is a block diagram of a microelectronic system 1000 implemented according to one or more embodiments described herein. The microelectronic system 1000 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The microelectronic system 1000 includes at least one memory device 1002, which includes one or more microelectronic device structures 101', microelectronic devices 100 as previously described. The microelectronic system 1000 may further include at least one processor 1004, such as a microprocessor, to control the processing of system functions and requests in the microelectronic system 1000. The processor 1004 and other subcomponents of the microelectronic system 1000 may include the memory cells. The processor 1004 may, optionally, include one or more microelectronic device structures 101' as previously described.

Various other devices may be coupled to the processor 1004 depending on the functions that the microelectronic system 1000 performs. For example, an input device 1006 may be coupled to the processor 1004 for inputting information into the microelectronic system 1000 by a user, such as, for example, a mouse or other pointing device, a button, a switch, a keyboard, a touchpad, a light pen, a digitizer and stylus, a touch screen, a voice recognition system, a microphone, a control panel, or a combination thereof. An output device 1008 for outputting information (e.g., visual or audio output) to a user may also be coupled to the processor 1004. The output device 1008 may include an LCD display, an SED display, a CRT display, a DLP display, a plasma display, an OLED display, an LED display, a three-dimensional projection, an audio display, or a combination thereof. The output device 1008 may also include a printer, an audio output jack, a speaker, etc. In some embodiments, the input device 1006 and the output device 1008 may comprise a single touchscreen device that can be used both to input information to the microelectronic system 1000 and to output visual information to a user. The one or more input devices 1006 and output devices 1008 may communicate electrically with at least one of the memory devices 1002 and the processor 1004. The at least one memory device 1002 and processor 1004 may also be used in a system on chip (SoC).

Accordingly, disclosed is a microelectronic system comprising an input device, an output device, a processor device operably coupled to the input device and the output device, and memory devices operably coupled to the processor device. One or more of the memory devices comprises memory pillars extending vertically through tiers of alternating oxide materials and conductive materials. A doped dielectric material is over the tiers and comprises a varying dopant concentration along a height of the doped dielectric material.

Although the features are discussed relative to NAND memory devices, the features may be used in other memory devices, including but not limited to, DRAM devices.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:

tiers of alternating dielectric materials and conductive materials;

a cap dielectric material adjacent to the tiers;

pillars extending through the tiers;

a doped dielectric material vertically adjacent to the tiers and the cap dielectric material, the doped dielectric material comprising a heterogeneous chemical composition comprising one or more dopants; and conductive contact structures in the doped dielectric material.

2. The microelectronic device of claim 1, wherein the doped dielectric material comprises a gradient of the one or more dopants.

3. The microelectronic device of claim 1, wherein the doped dielectric material comprises regions, one or more of the regions comprising a different concentration of the one or more dopants relative to other of the one or more regions.

4. The microelectronic device of claim 1, wherein the doped dielectric material comprises two or more regions, one of the two or more regions comprising a different concentration gradient of the one or more dopants relative to other of the two or more regions.

5. The microelectronic device of claim 1, wherein a lower region of the doped dielectric material comprises a relatively lower concentration of the one or more dopants than an upper region of the doped dielectric material.

6. The microelectronic device of claim 1, wherein a lower region of the doped dielectric material comprises a relatively higher concentration of the one or more dopants than an upper region of the doped dielectric material.

7. The microelectronic device of claim 1, wherein the doped dielectric material comprises doped silicon oxide.

8. The microelectronic device of claim 1, wherein the one or more dopants comprises phosphorous, boron, carbon, nitrogen, or a combination thereof.

9. The microelectronic device of claim 1, wherein a lower region of the doped dielectric material comprises a first concentration of the dopant and an upper region of the doped dielectric material comprises a second, different concentration of the dopant.

10. The microelectronic device of claim 1, wherein a lower region of the doped dielectric material comprises a first dopant and an upper region of the doped dielectric material comprises a second, different dopant.

11. The microelectronic device of claim 10, wherein the lower region of the doped dielectric material comprises a gradient of the first dopant and the upper region of the doped dielectric material comprises a gradient of the second dopant.

12. A microelectronic device, comprising:

tiers of alternating dielectric materials and conductive materials;

pillars extending through the tiers;

a doped dielectric material vertically adjacent to the tiers, the doped dielectric material comprising two or more dopants heterogeneously distributed therein;

an oxide material between the tiers and the doped dielectric material; and conductive contact structures in the doped dielectric material vertically adjacent to the pillars, a critical dimension of the conductive contact structures less than a critical dimension of the pillars.

13. The microelectronic device of claim 12, wherein the conductive contact structures exhibit substantially vertical sidewalls.

14. The microelectronic device of claim 12, wherein the conductive contact structures exhibit tapered sidewalls.

15. The microelectronic device of claim 12, wherein the doped dielectric material comprises discrete regions and one of the discrete regions comprises a relative greater concentration of the two or more dopants than another of the discrete regions.

16. The microelectronic device of claim 12, wherein the doped dielectric material comprises a gradient of the two or more dopants.

17. A microelectronic system, comprising:

an input device;

an output device;

a processor device operably coupled to the input device and the output device; and memory devices operably coupled to the processor device, one or more of the memory devices comprising:

memory pillars extending vertically through tiers of alternating oxide materials and conductive materials; and a doped dielectric material over the memory pillars, the doped dielectric material comprising a varying dopant concentration along a height of the doped dielectric material.

18. The microelectronic system of claim 17, wherein the dopant concentration of the doped dielectric material is relatively higher proximal to the tiers.

19. The microelectronic system of claim 17, further comprising a cap dielectric material and a barrier material between the tiers and the doped dielectric material, the doped dielectric material direct contacting the barrier material and the cap dielectric material direct contacting the barrier material.

20. A method of forming a microelectronic device, comprising:

forming tiers of alternating conductive materials and dielectric materials and pillars extending vertically through the tiers;

forming a cap dielectric material adjacent to the tiers;

forming a doped dielectric material vertically adjacent to the tiers and the cap dielectric material, the doped dielectric material comprising a heterogeneous chemical composition and formulated to exhibit different etch rates at different portions of the doped dielectric material;

removing a portion of the doped dielectric material to form openings in the doped dielectric material;

removing an additional portion of the doped dielectric material to increase a width of the openings in the doped dielectric material; and forming conductive contact structures in the openings, a critical dimension of the conductive contact structures relatively less than or equal to a critical dimension of the pillars.

21. The method of claim 20, wherein forming a doped dielectric material adjacent to the tiers comprises forming the doped dielectric material comprising a greater dopant concentration proximal to the tiers.

22. The method of claim 21, wherein removing a portion of the doped dielectric material to form openings and removing an additional portion of the doped dielectric material to increase a width of the openings comprises removing the portion of the doped dielectric material at a faster etch rate than removing the additional portion of the doped dielectric material.

23. The method of claim 20, wherein forming a doped dielectric material adjacent to the tiers comprises forming the doped dielectric material comprising a gradient of one or more dopants.

24. The method of claim 20, wherein removing a portion of the doped dielectric material to form openings comprises removing the portion using a dry etch process.

25. The method of claim 20, wherein removing a portion of the doped dielectric material to form openings comprises removing the portion using a wet etch process.

* * * * *